United States Patent
Bachmann

(10) Patent No.: US 6,922,648 B2
(45) Date of Patent: Jul. 26, 2005

(54) TUNING CHART FOR DEVICES UNDER TEST

(75) Inventor: James Thomas Bachmann, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/859,092

(22) Filed: Jun. 3, 2004

(65) Prior Publication Data

US 2004/0220764 A1 Nov. 4, 2004

Related U.S. Application Data

(62) Division of application No. 10/112,943, filed on Apr. 2, 2002, now Pat. No. 6,775,634.

(51) Int. Cl.[7] ............................. G01R 35/00; G09G 5/00
(52) U.S. Cl. ..................... 702/107; 345/440; 345/440.1
(58) Field of Search .................................. 702/107, 108, 702/117, 127; 345/440, 440.1, 473; 455/256; 324/601, 637, 638

(56) References Cited

U.S. PATENT DOCUMENTS 5,757,357 A * 5/1998 Grande et al. ........... 345/440.1

6,590,577 B1 * 7/2003 Yonts ........................ 345/440

* cited by examiner

Primary Examiner—Michael Nghiem
Assistant Examiner—John Le

(57) ABSTRACT

An improved apparatus and method for tuning a device under test uses a spider diagram-like chart that provides the operator with visual cues as to the tuning status of a device under test (DUT). The spider diagram may be displayed on a graphical user interface (GUI), along with various adjustment points or potentiometers. The spider diagram includes a unit circle that represents the acceptable bounds for each measured parameter. Overlaying the unit circle is a polygon of three or more sides, with a vertex of each angle of the polygon representing a measured parameter. The polygon changes shape as the various potentiometers are adjusted. When a measured parameter value is at the center of its allowable range, the vertex of the angle corresponding to that measurement lies near the center of the unit circle. When a measured parameter is at its upper or lower bound, the vertex lies on the unit circle. When a measure parameter is less than its lower limit, or more than its upper limit, the vertex lies outside the unit circle.

8 Claims, 5 Drawing Sheets

US 6,922,648 B2

TUNING CHART FOR DEVICES UNDER TEST

This application is a Divisional of application 10/112,943 filed on Apr. 2, 2002, now U.S. Pat. No. 6,775,634.

TECHNICAL FIELD

The technical field is test equipment for electrical and electronic test components.

BACKGROUND

Electrical and electronic test components, such as multi-channel power amplifiers, require tuning in order to operate correctly. To properly tune such a component, an operator typically adjusts one or more potentiometers or other adjustment devices that are installed on the component. When the component is a complex device such as the multi-channel power amplifier, adjustment of the potentiometers, and correct tuning of the component may be a difficult and lengthy process because adjustment of one parameter can affect the setting of other parameters.

SUMMARY

An improved apparatus and method for tuning a device under test (DUT) uses a spider diagram-like chart that provides the operator with visual cues as to the tuning status of the DUT. The spider diagram may be displayed on a graphical user interface (GUI), along with visual representations of the various adjustment points or potentiometers. The spider diagram includes a unit circle that represents the acceptable bounds for each measured parameter. Overlaying the unit circle is a polygon of three or more sides, with a vertex of each angle of the polygon representing a measured parameter. Bisecting each vertex may be an axis that represents the range of measured values associated with the corresponding parameter. The intersection of the axis and the vertex may represent the current measured value of the parameter. The polygon changes shape as the various potentiometers are adjusted. When a measured parameter value is at the center of its allowable range, the vertex of the angle corresponding to that measurement lies near the center of the unit circle. When a measured parameter is at its upper or lower bound, the vertex lies on the unit circle. When a measure parameter is less than its lower limit, or more than its upper limit, the vertex lies outside the unit circle.

DESCRIPTION OF THE DRAWINGS

The detailed description will refer to the following drawings, wherein like numerals refer to like elements, and wherein.

DETAILED DESCRIPTION

Figure 1:
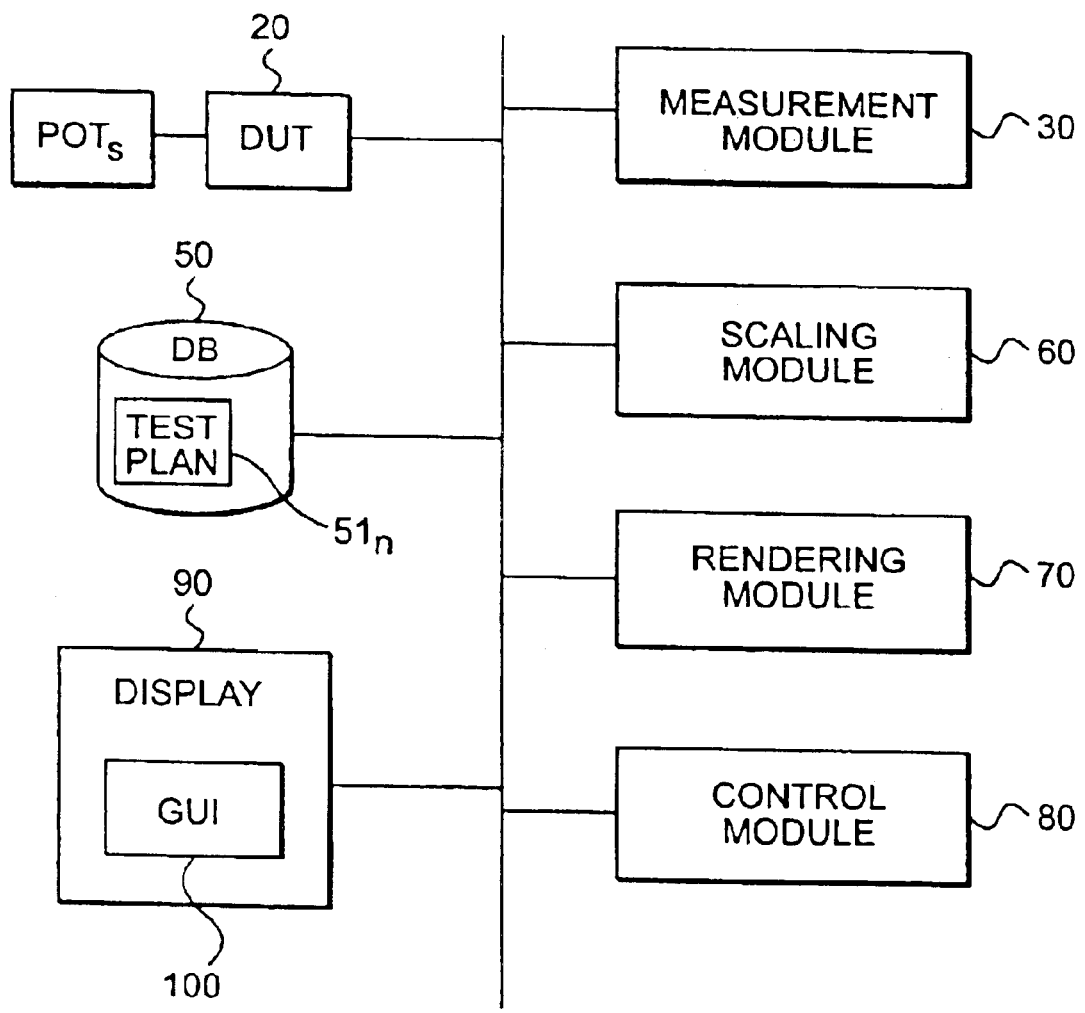
FIG. 1 is a diagram of a system used for tuning a device under test.

FIG. 1 is a block diagram illustrating a system 10 used for tuning a device under test (DUT) 20. The DUT 20 may be any electronic or electrical component or system in which adjustment devices are available to vary operating parameters of the DUT 20 so as to properly tune the DUT 20. As an example, the DUT 20 may be a multi-channel power amplifier. The adjustment devices may be small potentiometers (POTs). Adjustment of the POTs will affect various measurements of the DUT 20. However, which parameter varies, and the direction and magnitude of that variation may not be apparent to the operator in advance of the adjustment. More importantly, when the operator attempts to vary one parameter, another parameter may change because more than one parameter of the DUT 20 may be affected by the POT adjustment (that is, the parameters are competing). The affect of the POT adjustments may be shown on a graphical user interface (GUI) 100.

Typical parameters to be measured from the DUT 20 as embodied in a multi-channel power amplifier include S-parameters, adjacent channel power ratios, and spectrum emission mask, for example.

The system 10 may include a measurement module 30 that is coupled to the DUT 20. The measurement module 30 is used to measure specified parameters from the DUT 20. The parameters to be taken from the DUT 20 may be specified in a test plan $51_n$. The test plan $51_n$ may be stored in a database 50. The test plan $51_n$ also may include upper and lower allowable bounds for the measured parameters, scaling factors to be applied to measured values, and scaled ranges for the upper and lower bounds. The test plan $51_n$ may include additional information related to the measured parameters that is needed to provide a visual display of tuning to an operator. A scaling module 60 may rescale, or normalize the measured parameters to allow their display on the GUI 100. A rendering module 70 may generate various visual features to be displayed on the GUI 100, including POT emulators that show which POT is being adjusted, and the relative point of adjustment of each POT, and the affect of the POT adjustments on the competing measured parameters. The visual features will be described later. A control module 80 may control operation of the various components of the system 10, and may include logic to determine when all the measured parameters are within specification. Finally, the system 10 may include a display 90 on which the GUI 100 is shown.

The system 10 may be realized in a rack-mountable configuration, with the measurement module 30 as a separate component in a rack, and the database 50, the scaling module 60, the rendering module 70 and the control module 80 realized in a single housing, such as a personal computer, for example. The display 90 may also be rack-mounted, and may be realized as a CRT, a flat panel display, or any display capable of showing the GUI 100. The thus-realized system 10 may be connected to the DUT 20 using normal means for acquiring measurements.

Figure 2:
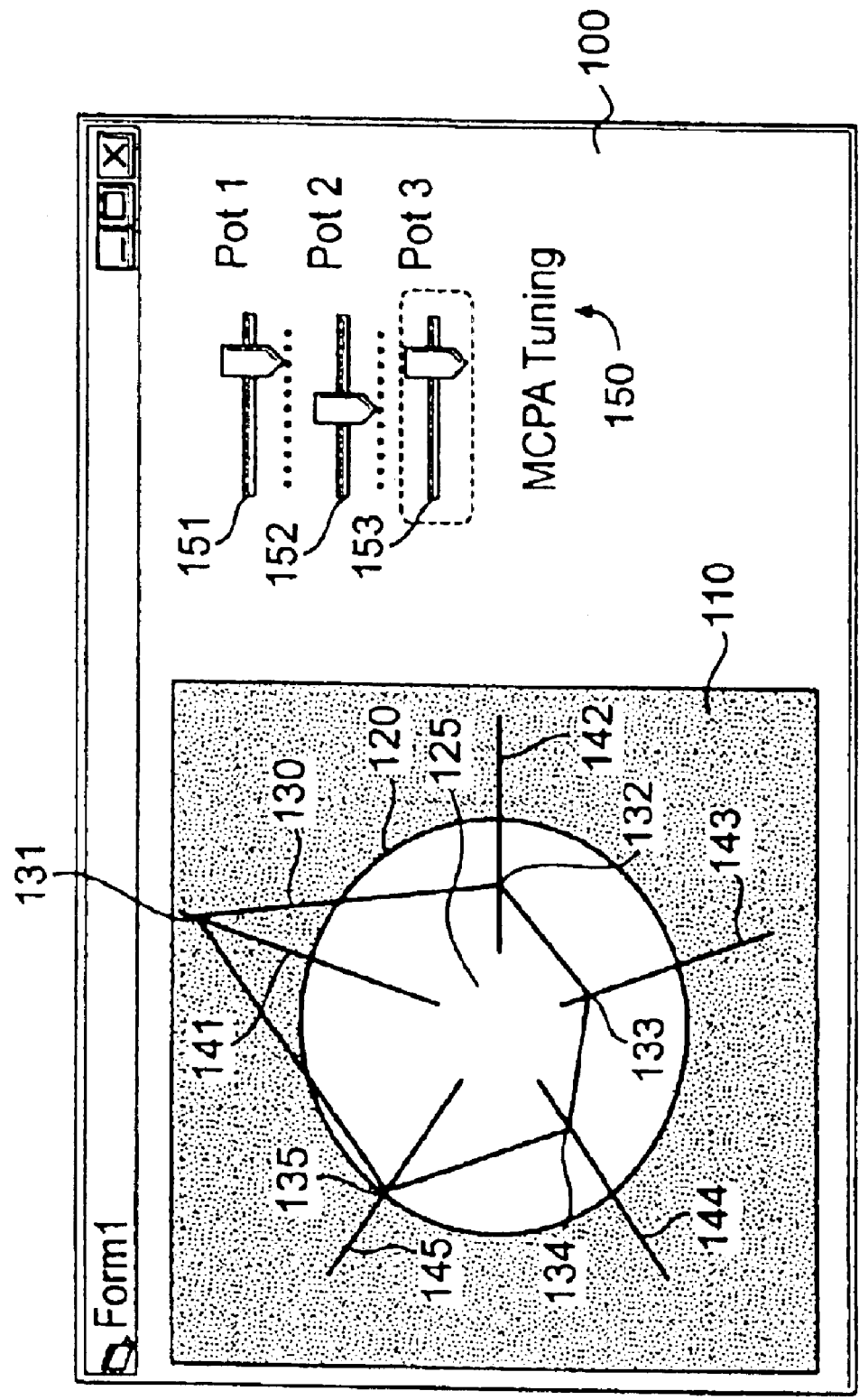
FIG. 2 is a spider diagram as displayed on a graphical user interface, where the diagram may be used to tune the device under test.

FIG. 2 illustrates the GUI 100 on which is displayed a spider-diagram like chart 110, which in turn is used to provide a visual representation of measurements being made on the DUT 20 (see FIG. 1). The chart 110 includes a unit circle 120 and a polygon 130. Also shown on the GUI 100 is a control section 150 representing the adjustments available to tune the DUT 20.

Measurements from the DUT 20 may be normalized, or scaled, so that a maximum and a minimum allowable value of each parameter can be represented by a point on the unit circle. For example, the range of allowable values for each parameter of the DUT 20 may be normalized to unity (one). Other scale or normalization values may also be used with the chart 110. A center 125 of the unit circle 120 represents a midpoint between the upper and lower bounds of the parameter's allowable values. However, to provide visual clarity for the operator, any measured parameter that is at the midpoint of its allowable range may be displayed with a slight offset from the center 125. If the upper or lower bounds of the parameter are exceeded, the measured value will be represented by a point plotted outside the unit circle 120. The further away the measured value is from the allowable values, the further away the plotted point will be from the center 125 of the unit circle 120. The measured parameters may be displayed as points on axes that intersects the unit circle.

In FIG. 2, the chart 10 includes the polygon 130 as a pentagon, implying that five parameters are being measured from the DUT 20. Each of the five parameters may be represented by one of vertices 131–135 of the polygon 130. Intersecting each of the vertices 131–135 is a corresponding axis 141–145, which represents the measured values of the parameter.

As shown in FIG. 2, the polygon 130 shows the five competing measurements with one measured value (in the example, at the vertex 131) out of specification. That is, the vertex 131 is outside the unit circle 120. Adjustment of one or more of the POTs is then required to move the vertex 131 down the axis 141 and onto or inside the unit circle 120. Optionally, a visible feature of the chart 110 can change when all measurements come into specification. For example, the unit circle 120 may turn green when all measurements are in specification (see FIG. 3). In an alternative embodiment, the chart 110 may display a text message 127 when all measurements are in specification.

The control section 150 may be used to emulate the POTs on the DUT 20. Actual adjustment of the POTs may be shown on the chart 110 as POT emulators 151–153 slide from left to right and back. The specific POT being adjusted may be highlighted as shown.

Figure 3:
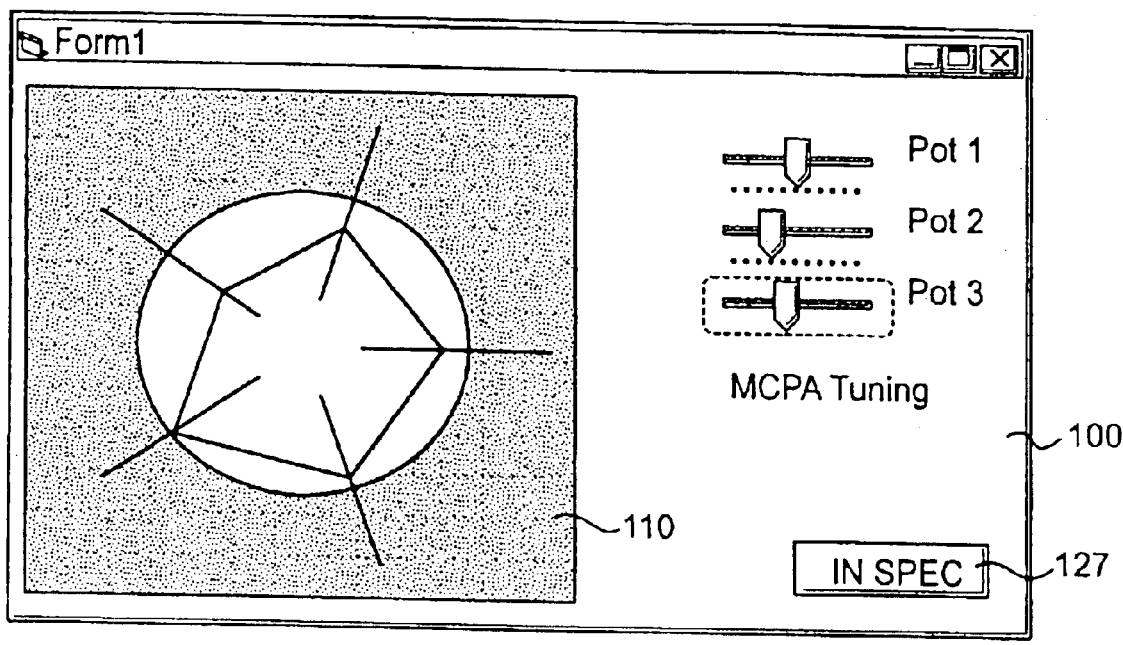
FIG. 3 is a further view of the diagram of FIG. 2 with all measurements within specification.

The chart 110 shown in FIGS. 2 and 3 shows the polygon 130 representing five measurements. The chart 110 may be used for more or less than five measurements. Ordinarily, the chart 110 may be used to represent at least three measurements. When representing three measurements, the chart 110 will be a triangle. A DUT with as few as two measurements may also use the chart 110. In this scenario, one of the two measured parameters would be duplicated to form the triangle.

Figure 4:
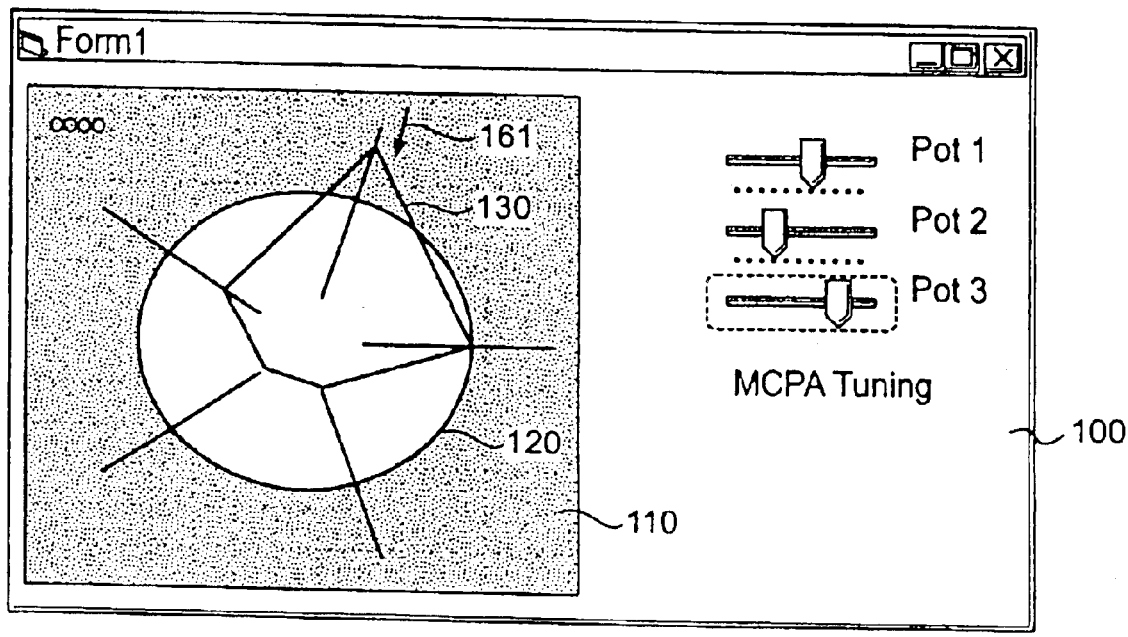
FIG. 4 is yet another view of the diagram of FIG. 2 with one measurement far out of specification.

FIG. 4 shows the chart 110 with the measurement at the vertex 131 far out of specification. In this situation, the measured value lies near the end of the axis 141, and outside the unit circle 120. Since it is not possible to represent just how far outside the unit circle 120 the out of specification measurement may be, an arrow 161 may be included on the chart 110 to indicate whether the measurement is moving in or moving out in response toe adjustment of the POTs.

In the examples of the chart 110 shown in FIGS. 2–4, the operator need not have any knowledge of the actual meaning and units of each of the measurements. Instead, the operator need only concentrate on placing the polygon 130 inside the unit circle 120.

Figure 5:
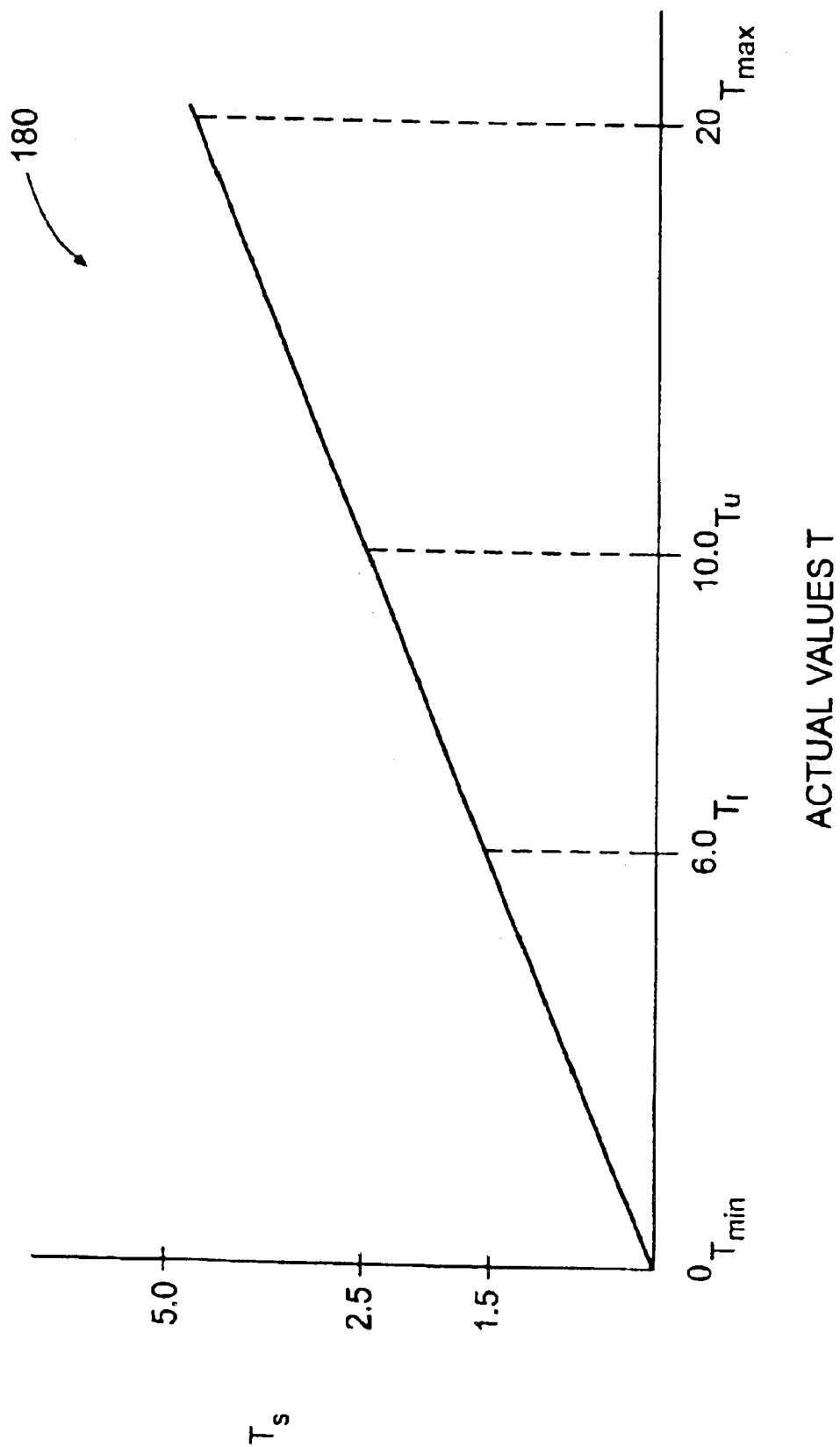
FIG. 5 is a graph illustrating a possible scaling methodology for use with the diagram of FIG. 2.

FIG. 5 is a graph 180 illustrating one possible means for scaling the parameters from the DUT 20 so that the measured values my be readily displayed on the chart 110. Other scaling methodologies may also be used. In addition, the chart 110 may be used without any scaling. In FIG. 5, a parameter T may have a minimum value, $T_{min}$, of zero, and a maximum value, $T_{max}$, of 20. The lower limit, $T_l$, for T may be 6.0 and the upper limit, $T_u$, may be 10.0. The allowable interval is thus 4.0. To display this range on the chart 110, a scaling factor of 4 may be used, thereby reducing the allowable interval to 1.0, the lower limit to 1.5, and the upper limit to 2.5. Any measured value of the parameter T will then be scaled by the scaling module 60 by dividing the measured value by 4. The thus-scaled value of the parameter T ($T_s$) may be displayed on the chart 110. When the scaled value $T_s$ is at 1.5 or 2.5, the corresponding vertex of the polygon 130 will lie on the unit circle 120. When the scaled value $T_s$ is between 1.5 and 2.5, the corresponding vertex of the polygon 130 will approach the center 125 of the unit circle 120. For visual clarity, the actual plotted point of the vertex may be offset by a small value from the center 125 of the unit circle 120. When the scaled value $T_s$ is less than 1.5 or greater than 2.5, the vertex of the polygon lies outside the unit circle 120. If the scaled value $T_s$ is sufficiently far from the unit circle 120 (for example, $T_s$ is 5), the arrow 161 may be displayed to show the direction of movement of $T_s$.

Figure 6:
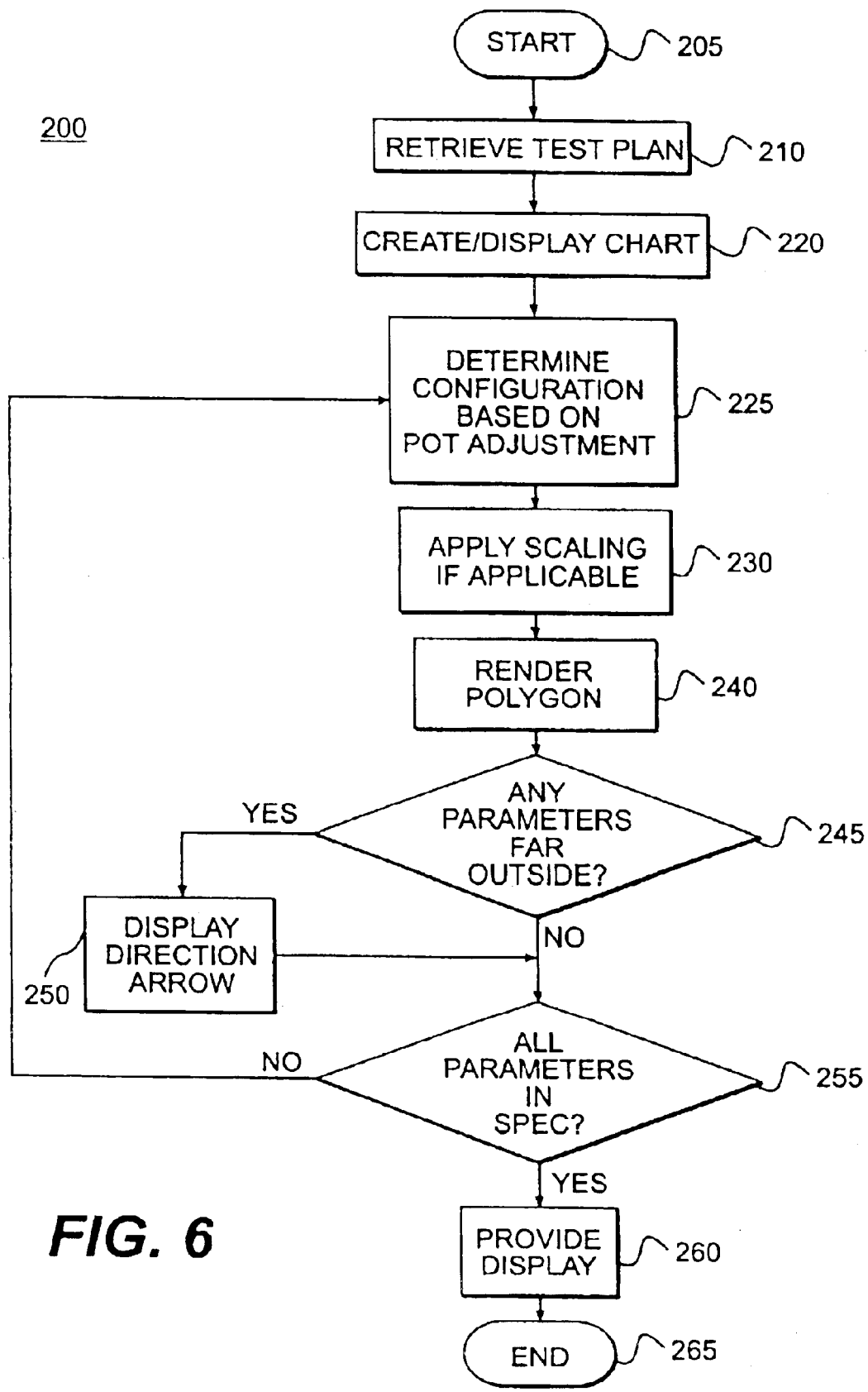
FIG. 6 is a flowchart illustrating the tuning process using the spider diagram of FIG. 2.

FIG. 6 is a flowchart illustrating a possible tuning operation 200 using the chart 110 of FIG. 2. The operation 200 starts at block 205 with the DUT 20 configured to provide measurements to the measurement module 30. In block 210, the test plan $51_n$ for the DUT is retrieved from the database 50, and the measurement module 30 is configured to measure the parameters of the DUT 20 specified in the test plan $51_n$.

In block 220, the rendering module 70 creates the chart 110 and displays the chart 110 with the GUI 100. Since at this point, no measurements may have been obtained from the DUT 20, the chart 110 may include the unit circle 120, the axes 141–145, and the POT emulators 151–153.

In block 225, the operator adjusts a POT on the DUT 20, and the resulting affect on the measured parameters is determined. The scaling module 60 scales the measured parameter values for display on the chart 110, and provides the scaling information to the rendering module 70, block 230. The rendering module 70 renders the polygon 130 with the vertexes 131–135 of the polygon 130 intersecting the corresponding axes 141–145 at some point, block 240. The rendering module 70 may also render the relative position of the adjusted POT on the control section 150. The control module 80 determines if any measured parameter value is sufficiently outside the unit circle 120, block 245. If any measured parameter is sufficiently outside the unit circle 120, the rendering module 70 may additionally display the arrow 161 indicating the direction of movement of the measured parameter value, block 250. The control module 80 determines if all measured parameter values are in specification (i.e., on or inside the unit circle), block 255. If all measured parameter values are in specification, the rendering module 70 changes the unit circle color to green, block 260. If one or more measured parameter values is out of specification, the operation returns to block 225, and the system 10 awaits further adjustments of the POTs on the DUT 20. Following block 260 the operation 200 ends, block 265.

While the invention has been described with reference to the above embodiments it will be appreciated by those of ordinary skill in the art that various modifications can be made to the structure and function of the individual parts of the system without departing from the spirit and scope the invention as a whole.

What is claimed is:

1. A method for tuning a device under test, comprising:

generating a spider chart for the device under test;

making adjustments to the device under test;

automatically updating the spider chart based on the adjustments;

providing an indication when all parameters of the device under test are within specification; and retrieving a test plan for the device under test, the test plan providing parameters to measure and specified values for the parameters.

2. The method of claim 1, wherein the spider chart comprises three or more axes, wherein an axis represents a range of possible measured values for a parameter, a polygon connecting the three or more axes, and a unit circle, wherein the polygon overlays the unit circle, and wherein each of the axes points to a center of the unit circle.

3. The method of claim 2, wherein the indication of within specification comprises the polygon lying on or inside the unit circle.

4. The method of claim 3, wherein the indication further comprises a visual display on a graphical user interface, the indication including one of a color change and a test message.

5. The method of claim 2, further comprising:

determining if one or more of the parameters is far out of specification, wherein a parameter is far out of specification when a measure value of the specification results in a point at or near an end of an axis opposite from the center of the unit circle; and displaying a direction arrow corresponding to a direction of adjustment for a measured parameter when a measured parameter is far out of specification.

6. The method of claim 1, further comprising scaling one or more parameters for display on the spider chart.

7. A method for tuning a device under test, comprising:

generating a spider chart for the device under test;

making adjustments to the device under test;

automatically updating the spider chart based on the adjustments;

providing an indication when all parameters of the device under test are within specification; and providing an emulation of the adjustments of the device under test, wherein the emulation is displayed with the spider chart, and wherein the emulation shows changes in the adjustments.

8. The method of claim 7, wherein the spider chart is dynamically displayed as a graphical user interface, and wherein the adjustments are dynamically displayed on the graphical user interface.

* * * * *